United States Patent [19]

James et al.

[11] 4,345,969

[45] Aug. 24, 1982

[54] METAL ETCH SOLUTION AND METHOD

[75] Inventors: Kristi L. James, Phoenix; A. L. Shields, Scottsdale, both of Ariz.

[73] Assignee: Motorola, Inc., Schaumburg, Ill.

[21] Appl. No.: 246,783

[22] Filed: Mar. 23, 1981

[51] Int. Cl.³ ............................ C23F 1/02; B44C 1/22; C03C 15/00; C03C 25/06
[52] U.S. Cl. ................................ 156/659.1; 156/656; 156/664; 156/666; 252/79.3; 252/79.4
[58] Field of Search ............. 156/656, 659.1, 664–666; 252/79.3, 79.4, 142; 430/313, 316, 318

[56] References Cited

U.S. PATENT DOCUMENTS 2,981,609  4/1961  Acker et al. ..................... 252/79.3
3,960,741  6/1976  Gabrail ........................ 252/79.4 X
4,220,706  9/1980  Spak ............................ 252/79.3 X Primary Examiner—William A. Powell
Attorney, Agent, or Firm—John A. Fisher

[57] ABSTRACT

A solution is disclosed for the one-step etching of a three layer titanium-nickel-copper metallization. The etch solution comprises about 1.8 to 2.0 moles/liter hydrofluoric acid, about 2.5 to 4.0 moles/liter acetic acid, about 8.7 to 9.0 moles/liter nitric acid, and balance water. Use of the solution permits the patterned etching of sequential layers of titanium, nickel, and copper without excessive attack of underlying silicon dioxide layers.

9 Claims, 4 Drawing Figures

“METAL ETCH SOLUTION AND METHOD

BACKGROUND OF THE INVENTION

This invention relates in general to a metal etch solution and method and more particularly to an etch solution and method for patterning sequential layers of titanium, nickel, and copper.

A number of metallization systems have been developed for contacting and interconnecting semiconductor devices including diodes, transistors, integrated circuits, and the like. One such metallization system includes sequential layers of titanium, nickel, and copper. The titanium makes a good ohmic contact to the semiconductor material; the nickel provides a barrier layer, and the copper is a good and inexpensive current-carrying material. Fabrication of a semiconductor device requires that the metal be patterned to contact selected device regions. Other portions of the semiconductor device are often passivated or protected by thermally grown or deposited layers of silicon dioxide. Etching the metal layers must be accomplished without seriously etching these regions of silicon dioxide.

There has not heretofore existed a good etchant or method suitable for etching three metal layers, especially sequential layers of titanium, nickel and copper, in a one-step etch process. It has been necessary to etch each of the metal layers in a separate etch solution. The separate etching of each individual layer requires separate etch baths and then rinsing between each etching to prevent contamination of an etch bath with residual etchant from the previous etch bath. This presents problems with preserving the integrity of the etch mask used to define the metal pattern. Caution must also be exercised to avoid oxidation of one metal layer during or after the etching of the above-positioned metal layer. Formation of an oxide interferes with the normal etching of the metal layer.

Accordingly, a need existed to develop an etch solution and method for the one-step etching of sequential metal layers. It is therefore an object of this invention to provide an etch solution for the etching of sequential layers of titanium, nickel, and copper.

It is another object of this invention to provide a one-step method for the etching of sequential layers of titanium, nickel, and copper.

It is still another object of this invention to provide an improved etchant for etching multiple layer metal structures on semiconductor devices.

It is a further object of this invention to provide an improved etch solution and method for patterning multilayer metal systems without adversely affecting underlying silicon dioxide regions.

SUMMARY OF THE INVENTION

The above mentioned and other objects and advantages are achieved in the present invention through the use of an etch solution which comprises about 1.8 to 2.0 moles/liter hydrofluoric acid, about 2.5 to 4.0 moles/liter acetic acid, about 8.7 to 9.0 moles/liter nitric acid, and balance water. The patterned etching of sequential layers of titanium, nickel, and copper on a substrate which includes silicon dioxide is accomplished by providing an etch mask overlying the sequential layers. Portions of the metal layers exposed through the etch mask are etched by immersing the substrate in the etch solution until the exposed portions are removed.

DETAILED DESCRIPTION OF THE PREFERRED EMBODIMENTS

Figure 1:
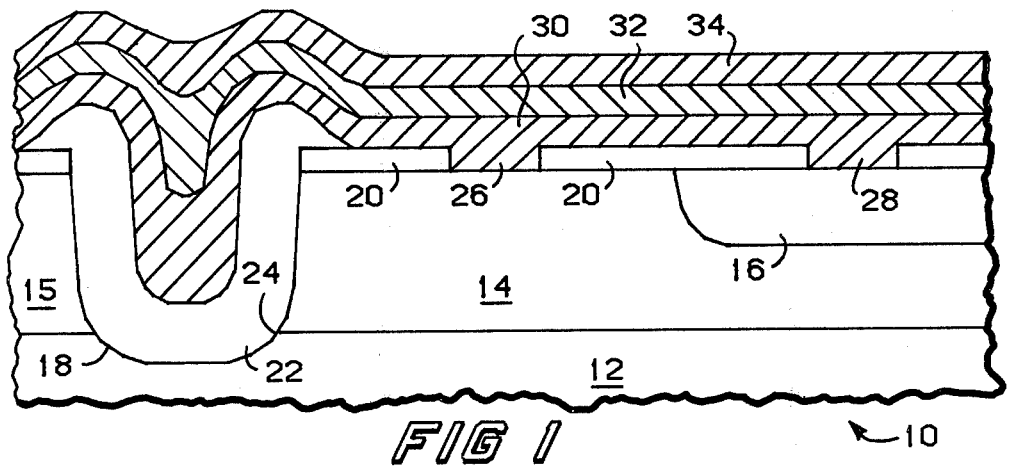
FIGS. 1–3 illustrate process steps in accordance with the invention for patterning sequential metal layers on a semiconductor substrate.

FIG. 1 illustrates in cross-section a portion of a semiconductor substrate 10. For illustrative purposes only, a mesa etched power transistor is illustrated. Substrate 10 includes a collector region 12, a base region 14 and an emitter 16. A moat 18 is etched into the upper surface of the substrate and extends through base 14 and into collector 12. The moat serves to isolate base 14 from the base 15 of an adjacent transistor being simultaneously formed in the same wafer. A layer of silicon dioxide 20 covers most of the upper surface of substrate 10. A deposited glass 22 partially fills the moat 18 and passivates the exposed collector base junction 24.

Openings 26, 28 are formed in oxide layer 20 to allow ohmic contact to the base and emitter, respectively. A metal layer is formed overlying the wafer surface and extending through the openings 26, 28. A particularly desirable metallization includes sequential layers of titanium 30, nickel 32, and copper 34.

Figure 2:
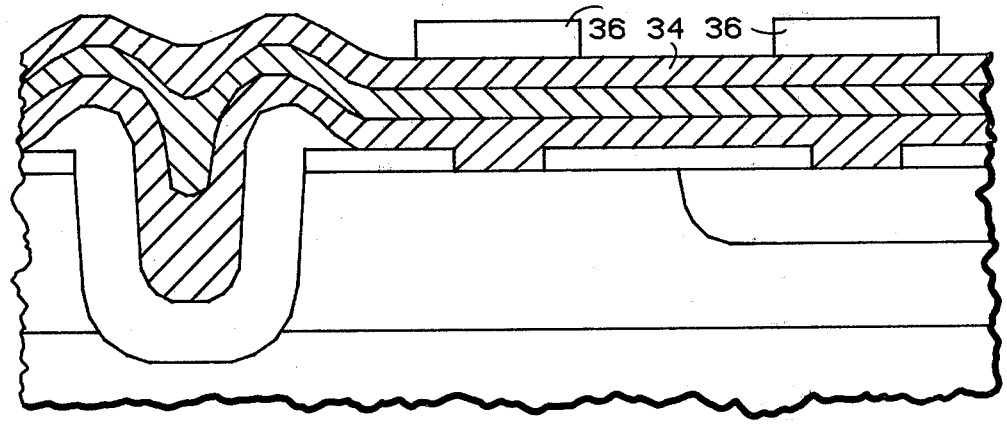

In accordance with the invention, the titanium, nickel, copper metallization is patterned in a one-step etching process. As illustrated in FIG. 2, an etch mask 36 is formed overlying and in contact with the layer of copper 34. The etch mask, for example photolithographically patterned photoresist, protects that portion of the metal layers which is to remain after the etching.

Figure 3:
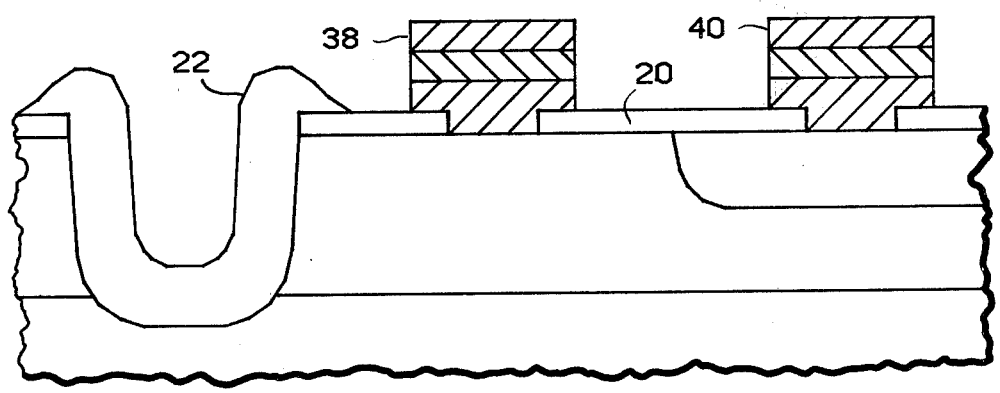

Substrate 10 with etch mask 36 is immersed in an etch solution, in accordance with the invention, comprising about 1.8 to 2.0 moles/liter hydrofluoric acid, about 2.5 to 4.0 moles/liter acetic acid, about 8.7 to 9.0 moles/liter nitric acid, and balance water. Preferably, the etch solution comprises about 1.9 moles/liter hydrofluoric acid, about 2.5 moles/liter acetic acid, and about 8.7 moles/liter nitric acid, and balance water. The solution can further include a small amount of a surfactant to promote uniform wetting of the exposed metal layers. After about 30 seconds of etching with the etch solution at a temperature of about 48° C., the titanium, nickel, and copper are totally removed except where protected by the etch mask. The etch mask is then removed and the structure appears as illustrated in FIG. 3. The remaining metal 38, 40 contacts the base and emitter, respectively, of the transistor. The edges of the metal are sharp, clean cut, and well defined. The exposed oxide 20 and glass 22 are relatively unetched.

Figure 4:
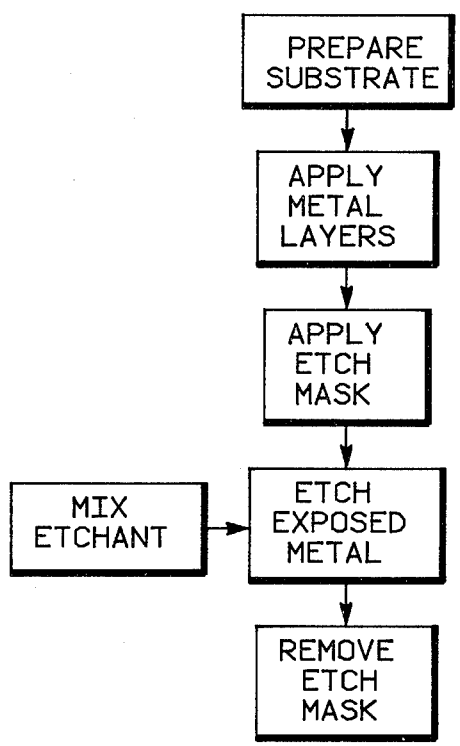
FIG. 4 provides a flow chart illustrating preferred process steps.

The following non-limiting example further and more specifically illustrates practice of the invention. The example follows the process flow illustrated in FIG. 4. A number of power transistor wafers having the above-described structure are prepared. A layer of thermally grown silicon dioxide having a thickness of about 0.3 micrometers covers the surface of the wafers. The oxide layer has a uniform color across the surface of the wafer, indicating uniformity of thickness. Contact openings are etched through the oxide to expose contact areas on the underlying semiconductor material. A layer of titanium having a thickness of about 50–100 nanometers is formed over the surface of the oxide and extends into contact openings and makes contact to the exposed semiconductor material. A layer of nickel having a thickness of 300-500 nanometers is formed over the titanium. Finally, a layer of copper having a thickness of about 4000-6000 nanometers is formed on the nickel. A layer of negative photoresist is spun on the copper and patterned in conventional manner to form an etch mask. The etch mask remains over and protects those portions of the metal layers which are to be left on the completed device.

One liter of etch solution is prepared by mixing together 33 milliliters of hydrofluoric acid, 145 milliliters of acetic acid, 387 milliliters of nitric acid, and 435 milliliters of water. The etch solution is heated to a temperature of 48° C. A wafer having the etch mask thereon is immersed in the etch solution for 30 seconds. At the end of this time the wafer is removed, rinsed in water, and dried. The wafer is examined and found to have a well defined metal pattern replicating the etch mask shape. the oxide layer exposed where the metal has been etched away is of uniform color and evidences little signs of etching.

In similar manner additional wafers are prepared for etching. Acceptable etching, that is replication of the etch mask pattern, good edge definition, total removal of the unwanted material, and little attack of the underlying oxide, are achieved with etchant solutions containing about 1.8 to 2.0 moles/liter hydrofluoric acid, about 2.5 to 4.0 moles/liter acetic acid, about 8.7 to 9.0 moles/liter nitric acid, and balance water. For best etching results, the etching is preferably accomplished at a temperature of about 43° to 50° C. Varying thicknesses of the metal layers are etched by adjusting the etch time and/or temperature. To improve surface wetting, in some instances a surfactant such as a few drops of detergent is added to the etch solution.

In constituting the etch solution, the percentage of hydrofluoric acid is kept low to avoid excessive attack of the underlying silicon dioxide. Total elmination of the hydrofluoric acid, however, results in unacceptable metal etching. The acetic acid in the etch solution promotes good edge definition. The percentage of nitric acid is selected to optimize etching of the copper and nickel layers. The chemical reactions occurring during the etching are believed to be as follows:

$$Cu + 2HNO_3 \rightarrow Cu(NO_3)_2 + H_2 \uparrow$$

$$Ni + 2HNO_3 \rightarrow Ni(NO_3)_2 + H_2 \uparrow$$

$$Ni + 2CH_3COOH \rightarrow Ni(C_2H_3O_2)_2 + H_2 \uparrow$$

$$Ti + 4HF \rightarrow TiF_4 + 2H_2 \uparrow$$

Thus there has been provided, in accordance with the invention, a novel etch solution and method that fully meets the objects and advantages set forth above. The invention provides for the one-step etching of titanium, nickel, copper metallization. While the invention has been described in conjunction with specific embodiments thereof, it is not intended that the invention or its uses be so limited. The invention can be utilized, for example, in the patterning of metal layers on any substrate. Additionally, appropriate adjustments can be made, for example to the time of etching and etch temperature, to accommodate different relative metal thicknesses. Other variations and modifications will, of course, be apparent to those skilled in the art in light of the foregoing description. Accordingly, it is intended to embrace all such variations and modifications as fall within the scope of the invention.

We claim:

1. An etchant for the patterned etching of sequential layers of titanium, nickel and copper overlying a substrate including silicon dioxide which comprises, in moles/liter: about 1.8 to 2.0 hydrofluoric acid, about 2.5 to 4.0 acetic acid, about 8.7 to 9.0 nitric acid, and balance water.

2. The etchant of claim 1 comprising about 1.9 moles/liter hydrofluoric acid.

3. The etchant of claim 1 comprising in moles/liter about 1.9 hydrofluoric acid, 2.5 acetic acid, 8.7 nitric acid and balance water.

4. The etchant of claim 1 further comprising a surfactant.

5. A method for the patterned etching of sequential layers of titanium nickel and copper on a substrate which comprises the steps of: providing an etch mask overlying said sequential layers; immersing said substrate in an etchant solution comprising about 1.8 to 2.0 moles/liter hydrofluoric acid, about 2.5 to 4.0 moles/liter acetic acid, about 8.7 to 9.0 moles/liter nitric acid and balance water; and etching portions of said layers exposed through said mask in said solution until said exposed portions are removed.

6. The method of claim 4 wherein said solution is maintained at a temperature of about 43° to 50° C.

7. The method of claim 5 wherein said solution is maintained at a temperature of about 48° C.

8. The method of claim 4 wherein said etch mask comprises photoresist.

9. A method for metallizing a semiconductor device which comprises the steps of: applying to said device a first layer of titanium, a second layer of nickel and a third layer of copper; forming a patterned etch mask overlying said layer of copper; immersing said device in an etchant solution comprising about 1.8 to 2.0 moles/liter hydrofluoric acid, about 2.5 to 4.0 moles/liter acetic acid, about 8.7 to 9.0 moles/liter nitric acid and balance water; and removing said device from said solution after removing portions of said metal layers not covered by said etch mask.

* * * * *